(12) United States Patent
Nakahira et al.

(10) Patent No.: US 10,673,392 B2
(45) Date of Patent: Jun. 2, 2020

(54) DIGITAL AMPLIFIER AND OUTPUT DEVICE

(71) Applicant: SHARP KABUSHIKI KAISHA, Sakai, Osaka (JP)

(72) Inventors: Tsuyoshi Nakahira, Kobe (JP); Akihiro Nishigaki, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 9 days.

(21) Appl. No.: 16/306,683

(22) PCT Filed: Jan. 23, 2017

(86) PCT No.: PCT/JP2017/002178
§ 371 (c)(1),
(2) Date: Dec. 3, 2018

(87) PCT Pub. No.: WO2017/212676
PCT Pub. Date: Dec. 14, 2017

(65) Prior Publication Data
US 2019/0296696 A1     Sep. 26, 2019

(30) Foreign Application Priority Data

Jun. 10, 2016   (JP) ................... 2016-116625

(51) Int. Cl.
*H03F 1/34*     (2006.01)
*H03F 3/21*     (2006.01)
*H03F 3/217*    (2006.01)
*H03F 3/38*     (2006.01)

(52) U.S. Cl.
CPC ............... *H03F 1/34* (2013.01); *H03F 3/211* (2013.01); *H03F 3/217* (2013.01); *H03F 2200/03* (2013.01); *H03F 2200/129* (2013.01); *H03F 2200/171* (2013.01); *H03F 2200/264* (2013.01); *H03F 2200/351* (2013.01); *H03F 2200/462* (2013.01); *H03F 2203/21106* (2013.01); *H03F 2203/21157* (2013.01)

(58) Field of Classification Search
USPC ........................................ 330/10, 251, 207 A
See application file for complete search history.

(56) References Cited

U.S. PATENT DOCUMENTS

| 6,683,494 B2 * | 1/2004 | Stanley | ................. | H03F 3/2175 330/10 |
| 9,036,836 B2 * | 5/2015 | Zhang | ................... | H03F 3/2173 330/10 |
| 2011/0227645 A1 | 9/2011 | Mayuzumi et al. | | |
| 2011/0305353 A1 | 12/2011 | Lang et al. | | |

FOREIGN PATENT DOCUMENTS

| JP | 2000-295049 A | 10/2000 |
| JP | 2010-268211 A | 11/2010 |
| JP | 2011-199485 A | 10/2011 |

* cited by examiner

*Primary Examiner* — Hieu P Nguyen
(74) *Attorney, Agent, or Firm* — ScienBiziP, P.C.

(57) ABSTRACT

A digital amplifier includes a pulse-width adjustment circuit that adjusts the pulse width of a digital signal, a switching circuit that amplifies the output signal of the pulse-width adjustment circuit, and a feedback signal generator that generates a feedback signal based on the output signal of the switching circuit.

4 Claims, 6 Drawing Sheets

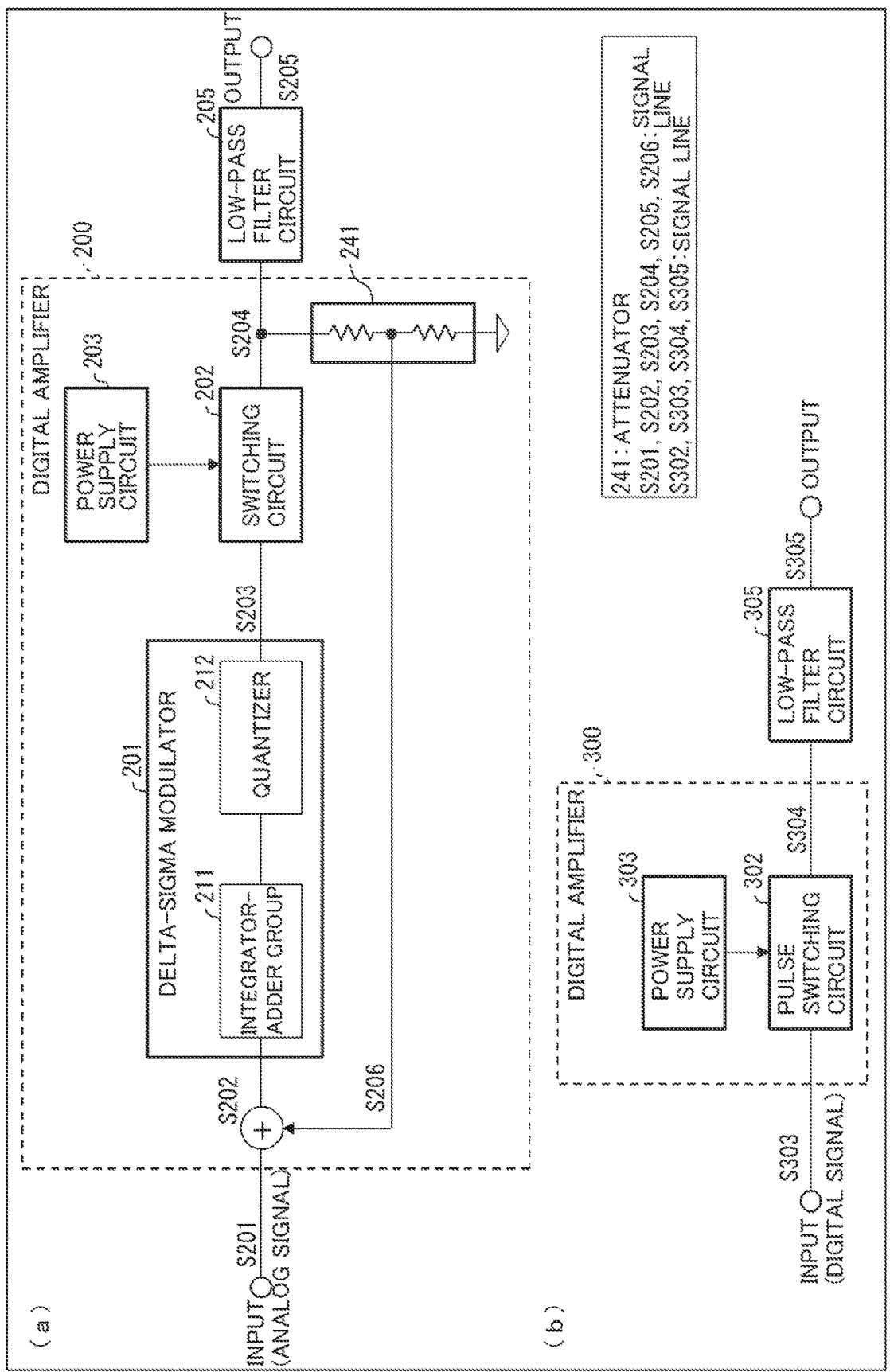

DIGITAL AMPLIFIER AND OUTPUT DEVICE

TECHNICAL FIELD

The present invention relates to a digital amplifier the input signal of which is a digital signal, and an output device including the digital amplifier.

BACKGROUND ART

A typical amplifier that amplifies, for example, an audio signal is a digital amplifier that uses a delta-sigma modulation. For example, PTL 1 discloses a digital switching amplifier that generates a quantization output signal by delta-sigma modulation of an audio input signal and that generates a switching signal by pulse amplification of the quantization output signal. The digital switching amplifier generates a feedback signal in a feedback loop for feedback on the switching signal by voltage reduction in the switching signal due to resistance division.

A structure disclosed in PTL 1 will be described with reference to FIG. 6(a). FIG. 6 illustrate the structure of digital amplifiers in conventional examples. FIG. 6(a) illustrates a digital amplifier 200, which is one of the conventional examples. As illustrated in FIG. 6(a), the digital amplifier 200 includes a delta-sigma modulator 201, a switching circuit 202, a power supply circuit 203, and an attenuator 241. The delta-sigma modulator 201 includes an integrator-adder group 211 and a quantizer 212. In the digital amplifier 200, an input signal that is an analog signal is inputted into a difference unit, and a feedback signal of a signal line S206 is inputted, as an input signal, into the difference unit by negative feedback from the switching circuit 202 via the attenuator 241. The difference unit calculates a difference between the input signal and the feedback signal and outputs a difference signal to a signal line S202.

CITATION LIST

Patent Literature

PTL 1: Japanese Unexamined Patent Application Publication No. 2000-295049 (published Oct. 20, 2000)

SUMMARY OF INVENTION

Technical Problem

According to the above existing technique, however, it is necessary for the feedback signal to be inputted into the difference unit at a front stage of the delta-sigma modulator 201. In other words, even when the input signal is a digital signal that is a binary signal according to a PDM (Pulse Density Modulation) method in which a waveform is represented by the density of a bitstream, the above existing technique needs the quantizer and a sampler, which originally are not needed. Accordingly, a circuit structure is complex, and there is a problem about accurate amplification of the input signal. In addition, there is another problem in that the use of the quantizer and the sampler imposes a limit on a digital signal processing speed at high-speed sampling frequencies such as 5.6 MHz, 11 MHz, and 22 MHz.

An example in which an input signal is a digital signal will now be described with reference to FIG. 6(b). FIG. 6(b) illustrates a digital amplifier 300, which is the other conventional example. As illustrated in FIG. 6(b), the digital amplifier 300 includes a pulse switching circuit 302 and a power supply circuit 303. The digital amplifier 300 has a problem in that feedback cannot be provided because the input signal of a signal line S303 and the output signal of a signal line S304 are digital signals.

An embodiment of the present invention has been accomplished in view of the above problems, and an object thereof is to provide a technique that enables a circuit structure to be simplified and enables feedback to be provided even when the input signal of a digital amplifier is a digital signal.

Solution to Problem

To solve the above problems, a digital amplifier according to an embodiment of the present invention includes a pulse-width adjustment circuit that adjusts a pulse width of a digital signal, a switching circuit that amplifies an output signal of the pulse-width adjustment circuit, and a feedback signal generator that generates a feedback signal based on an output signal of the switching circuit. The pulse-width adjustment circuit adjusts the pulse width of the digital signal with reference to the feedback signal.

To solve the above problems, an output device according to an embodiment of the present invention includes a first amplifier that amplifies a first digital signal, a second amplifier that amplifies a second digital signal that is in antiphase with the first digital signal, and a load that is connected to the first amplifier and the second amplifier. The first amplifier includes a first pulse-width adjustment circuit that adjusts a pulse width of the first digital signal, a first switching circuit that amplifies an output signal of the first pulse-width adjustment circuit, and a first feedback signal generator that generates a feedback signal based on an output signal of the first switching circuit. The first pulse-width adjustment circuit adjusts the pulse width of the digital signal with reference to the feedback signal. The second amplifier includes a second pulse-width adjustment circuit that adjusts a pulse width of the second digital signal, a second switching circuit that amplifies an output signal of the second pulse-width adjustment circuit, and a first feedback signal generator that generates a feedback signal based on an output signal of the second switching circuit. The second pulse-width adjustment circuit adjusts the pulse width of the digital signal with reference to the feedback signal.

Advantageous Effects of Invention

A digital amplifier according to an embodiment of the present invention has a simplified circuit structure and can provide feedback even when the input signal thereof is a digital signal.

BRIEF DESCRIPTION OF DRAWINGS

FIG. 2 illustrate block diagrams of the structure of principal parts of pulse-width adjustment circuits according to the first embodiment and a second embodiment of the present invention, in which FIG. 2(a) illustrates the block diagram of the structure of the principal part of the pulse-width adjustment circuit according to the first embodiment, and FIG. 2(b) illustrates the block diagram of the structure of the principal part of the pulse-width adjustment circuit according to the second embodiment.

FIG. 3 illustrate waveforms of signal lines of the pulse-width adjustment circuits according to the first and second embodiments of the present invention, in which FIG. 3(a) illustrates the waveforms of the signal lines of the pulse-width adjustment circuit illustrated in FIG. 2(a), and FIG. 3(b) illustrates the waveforms of the signal lines of the pulse-width adjustment circuit illustrated in FIG. 2(b).

FIG. 6 illustrate the structure of digital amplifiers in conventional examples, in which FIG. 6(a) illustrates the digital amplifier in one of the conventional examples, and FIG. 6(b) illustrates the digital amplifier in the other conventional example.

DESCRIPTION OF EMBODIMENTS

First Embodiment

Embodiments of the present invention will hereinafter be described in detail.
(Digital Amplifier 100)

Figure 1:
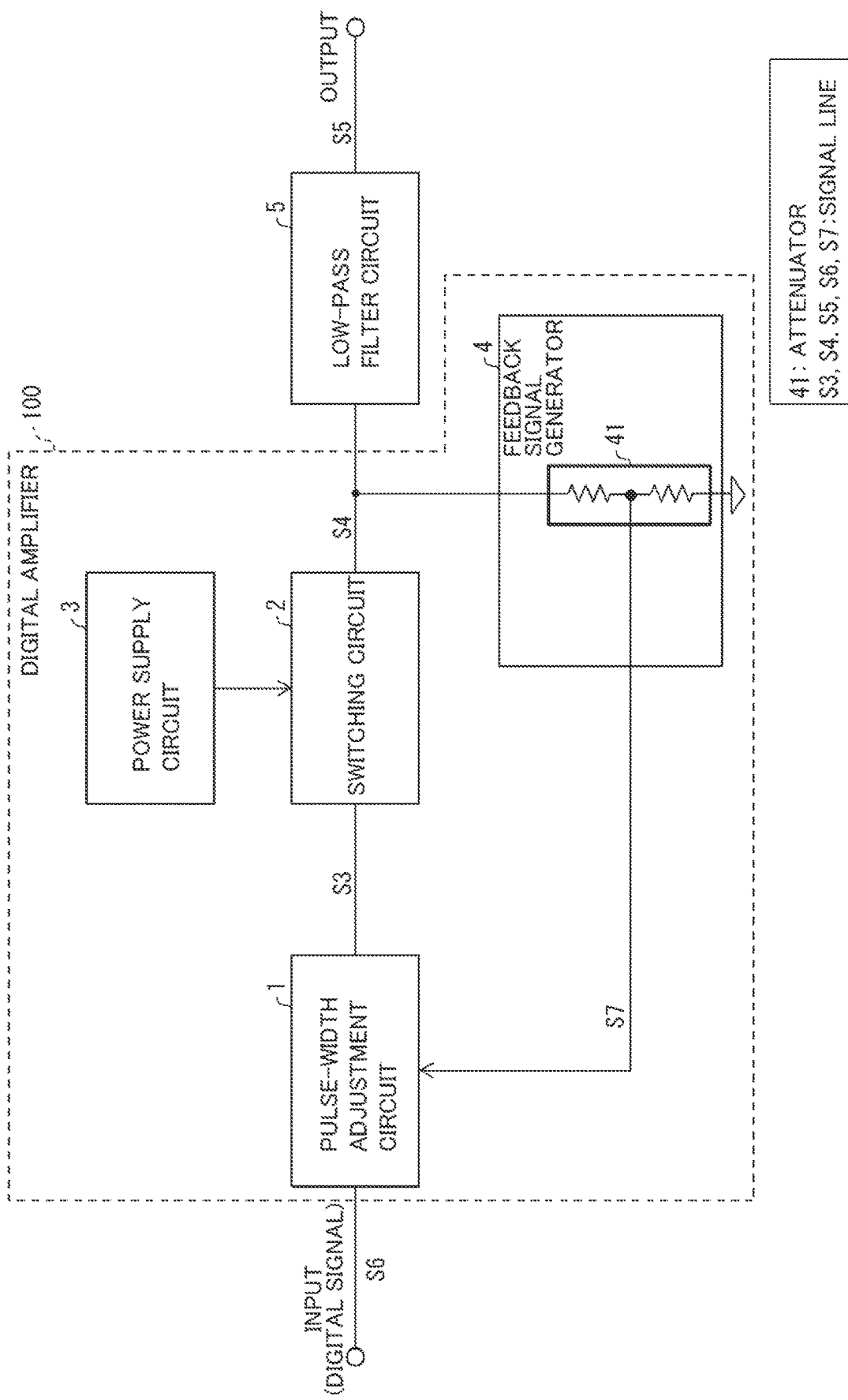
FIG. 1 illustrates a block diagram of the structure of a principal part of a digital amplifier according to a first embodiment of the present invention.

FIG. 1 illustrates a block diagram of the structure of a principal part of a digital amplifier 100 according to a first embodiment of the present invention. As illustrated in FIG. 1, the digital amplifier 100 includes a pulse-width adjustment circuit 1, a switching circuit 2, a power supply circuit 3, and a feedback signal generator 4.

A digital signal of a signal line S6 is inputted, as an input signal, into the digital amplifier 100. The digital amplifier 100 amplifies the inputted digital signal and outputs the amplified digital signal from a signal line S4. As illustrated in FIG. 1, a low-pass filter circuit 5 (low-pass filter) that extracts a low-frequency component is connected to the output side (a rear stage of the switching circuit 2) of the digital amplifier 100. This enables the digital amplifier 100 to amplify an inputted audio signal and output a digital signal for driving a speaker.

The pulse-width adjustment circuit 1 adjusts the pulse width of the digital signal. More specifically, the pulse-width adjustment circuit 1 adjusts the pulse width of the input signal of the signal line S6 based on the signal level of a feedback signal of a signal line S7 described later and outputs the modulated digital signal to a signal line S3. The structure of the pulse-width adjustment circuit 1 will described in detail later with reference to another figure.

The switching circuit 2 amplifies the voltage of the digital signal that is outputted from the pulse-width adjustment circuit 1 based on a power supply voltage that is outputted from the power supply circuit 3 and outputs the amplified voltage to the signal line S4.

The power supply circuit 3 is a power supply circuit for providing a power supply voltage used when the switching circuit 2 amplifies the voltage.

Figure 3:
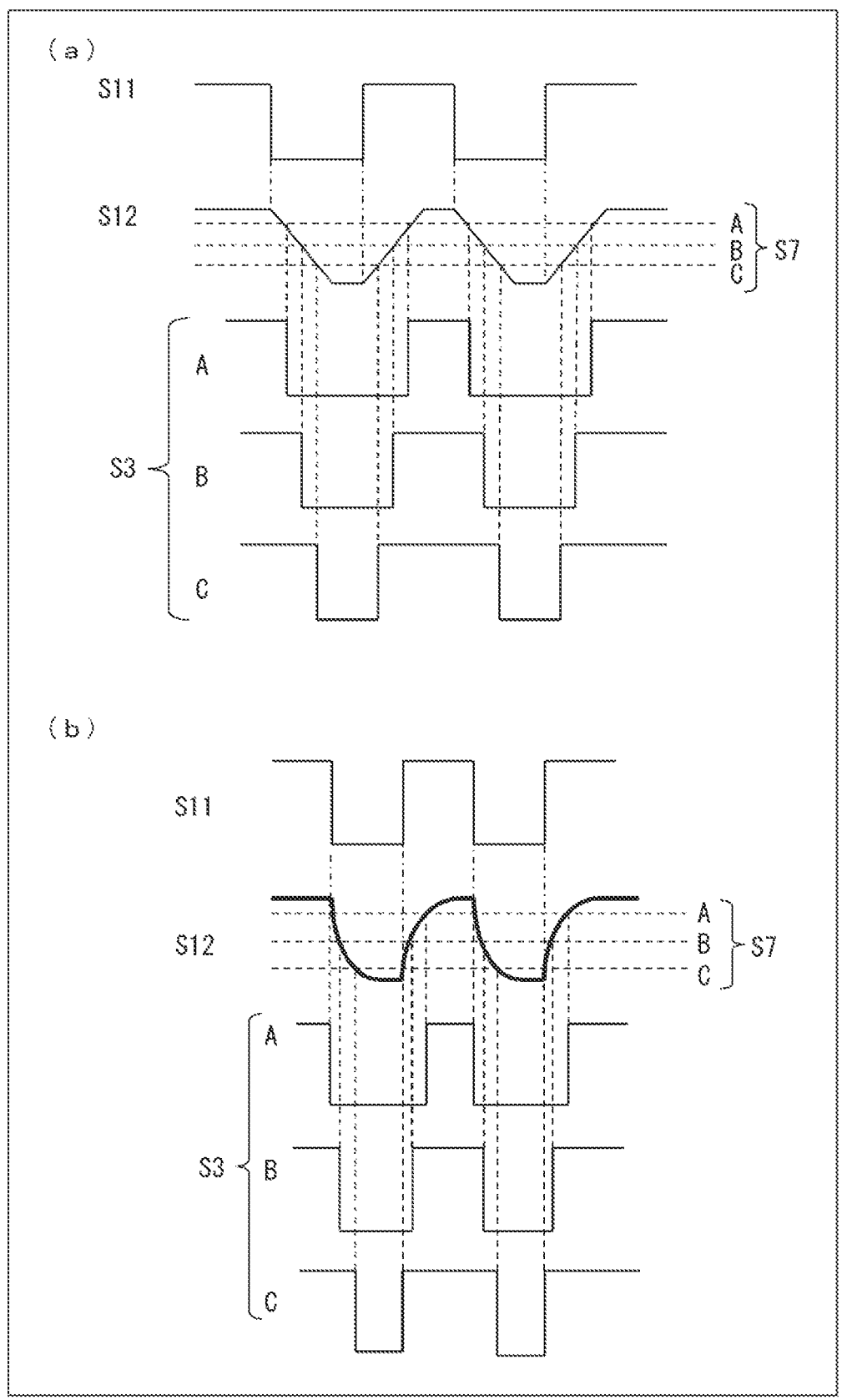

The feedback signal generator 4 generates the feedback signal based on a signal of the signal line S4 that is the output signal of the switching circuit 2 and outputs the generated feedback signal to the signal line S7. More specifically, the feedback signal generator 4 generates the feedback signal based on the signal of the signal line S4. In FIG. 3, the feedback signal generator 4 includes an attenuator 41, attenuates the signal of the signal line S4 by using the attenuator 41, and outputs the attenuated signal.

A member that generates the feedback signal may be included in a member that physically differs from the feedback signal generator 4. More specifically, an integrator that convers the output signal of the switching circuit 2 into an analog signal and a comparator that compares the output signal of the switching circuit 2 with a reference voltage may be physically included in the pulse-width adjustment circuit 1. In the disclosure, this case is also described such that the feedback signal generator 4 includes the member that generates the feedback signal.

(Pulse-Width Adjustment Circuit 1 According to First Embodiment)

Figure 2:
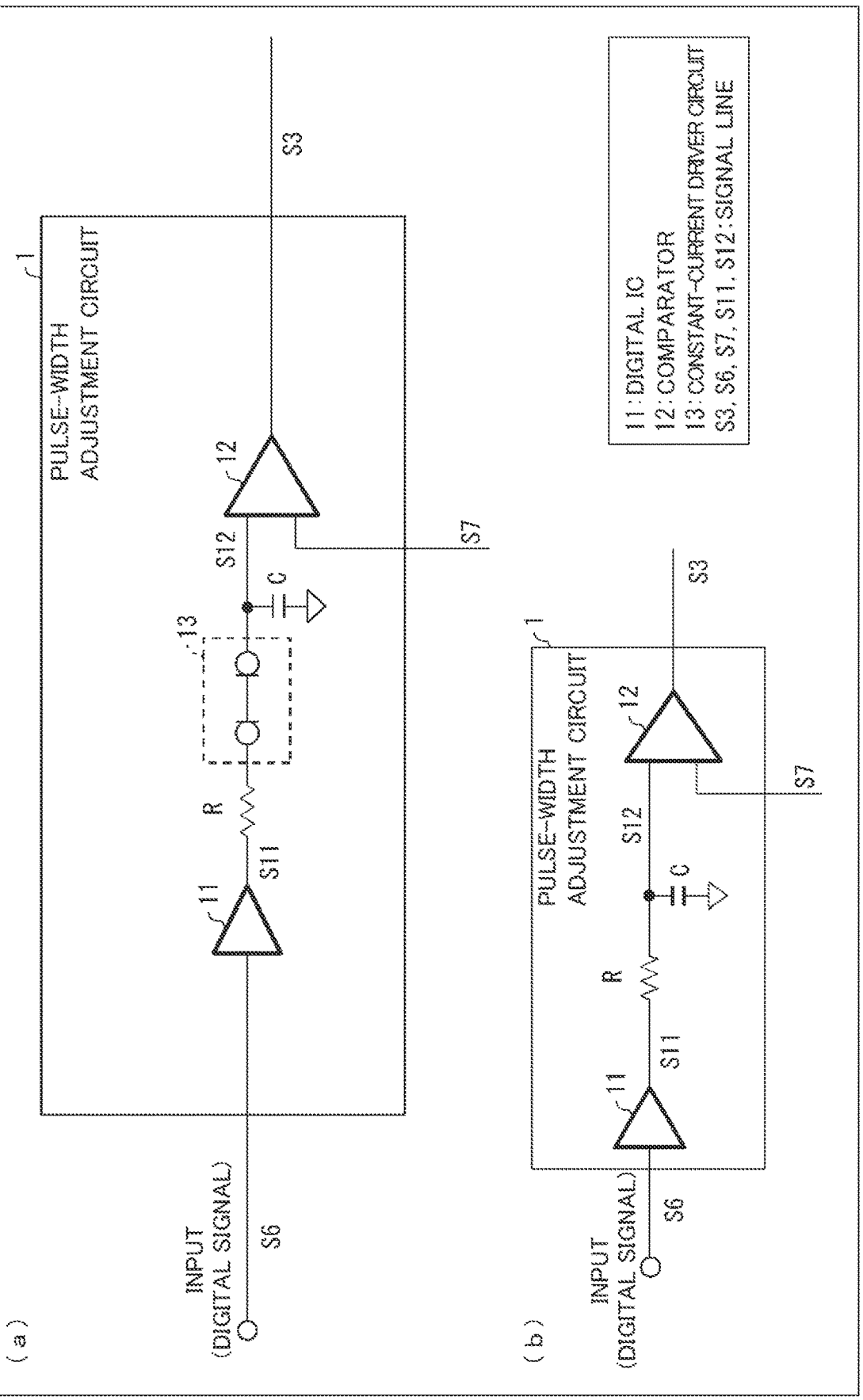

FIG. 2 illustrate block diagrams of the structure of principal parts of the pulse-width adjustment circuit 1 according to the first embodiment of the present invention and a pulse-width adjustment circuit 1 according to a second embodiment of the present invention, in which FIG. 2(a) illustrates the block diagram of the structure of the principal part of the pulse-width adjustment circuits 1 according to the first embodiment. The pulse-width adjustment circuit 1 according to the first embodiment will be described with reference to FIG. 2(a).

As illustrated in FIG. 2(a), the pulse-width adjustment circuit 1 includes a digital IC 11, a comparator 12, a constant-current driver circuit 13, a resistor R, and a capacitor C.

The digital IC 11 is a buffer for stabilizing a signal voltage.

The comparator 12 receives input signals that are inputted from a signal line S12 and the signal line S7 and outputs a binary (H and L), digital pulse based on the input. The operation of the comparator 12 will be described in detail later with reference to another figure.

The constant-current driver circuit 13 outputs the voltage of the input signal at a constant current.

The pulse-width adjustment circuits 1 according to the first and second embodiments include an integrating element that convers the feedback signal of the signal line S7 into an analog signal although this is not illustrated in FIG. 2(a).

FIG. 3(a) illustrates waveforms of the signal lines of the pulse-width adjustment circuit 1. FIG. 3 illustrate the waveforms of the signal lines of the pulse-width adjustment circuits 1 according to the first and second embodiments of the present invention, in which FIG. 3(a) illustrates the waveforms of the signal lines of the pulse-width adjustment circuit 1 illustrated in FIG. 2(a).

The digital signal of the signal line S6 is inputted into the digital IC 11. The digital IC 11 outputs a binary, digital pulse signal to a signal line S11. The signal of the signal line S11 travels through the resistor R, the constant-current driver circuit 13, and the capacitor C that is grounded and is inputted, as a signal of the signal line S12, into the comparator 12.

Since the signal of the signal line S12 comes through the constant-current driver circuit 13, the signal is a pulse signal having linear slopes at predetermined angles in both charge and discharge directions of the capacitor C, as illustrated in FIG. 3(a).

(Operation of Comparator 12)

The operation of the comparator 12 will be described with reference to FIG. 3(a).

The comparator 12 receives the signal that is inputted from the signal line S12 and the feedback signal that is inputted from the signal line S7 and outputs the binary, digital pulse based on the input, as described above. The description below includes examples in which the voltage of the feedback signal is a voltage A, and a voltage B, and a voltage C as illustrated in FIG. 3(a). The values of the voltage A, the voltage B, and the voltage C satisfy the relationship of the voltage A>the voltage B>the voltage C.

The comparator 12 outputs H when the value of the voltage of the signal that is inputted from the signal line S12 is larger than the value of the voltage of the feedback signal that is inputted from the signal line S7. The comparator 12 outputs L when the value of the voltage of the signal that is inputted from the signal line S12 is smaller than the value of the voltage of the feedback signal that is inputted from the signal line S7. Accordingly, when the voltage of the feedback signal is the voltage A, the duty ratio of the output signal is less than that in the case where the voltage of the feedback signal is the voltage B or the voltage C. When the voltage of the feedback signal is the voltage C, the duty ratio of the output signal is more than that in the case where the voltage of the feedback signal is the voltage A or the voltage B.

Second Embodiment

The second embodiment of the present invention will now be described. For convenience of description, members having the same functions as the members described according to the above embodiment are designated by like reference numbers, and a description thereof is omitted.
(Pulse-Width Adjustment Circuit 1 According to Second Embodiment)

FIG. 2(b) illustrates the block diagram of the structure of the principal part of the pulse-width adjustment circuit according to the second embodiment. The pulse-width adjustment circuit 1 according to the second embodiment will be described with reference to FIG. 2(b).

As illustrated in FIG. 2(b), the pulse-width adjustment circuit 1 includes the digital IC 11, the comparator 12, the resistor R, and the capacitor C. In other words, the pulse-width adjustment circuit 1 illustrated in FIG. 2(b) has the same structure as the pulse-width adjustment circuit 1 illustrated in FIG. 2(a) except that the constant-current driver circuit 13 is not provided. The waveforms of the signal lines of the pulse-width adjustment circuit 1 illustrated in FIG. 2(b) will be described with reference to FIG. 3(b).

FIG. 3(b) illustrates the waveforms of the signal lines of the pulse-width adjustment circuit 1 illustrated in FIG. 2(b). As illustrated in FIG. 3(b), straightness of the slopes of the signal of the signal line S12, which differs from the feedback signal, of the inputs of the comparator 12 is less than that in FIG. 3(a). However, the pulse-width adjustment circuit 1 illustrated in FIG. 2(b) enables response characteristics of a constant-current circuit to be prevented from being limited unlike the pulse-width adjustment circuit 1 illustrated in FIG. 2(a).

As illustrated in FIG. 3(b), the waveforms of the output signal (signal of the signal line S3) of the comparator 12 of the pulse-width adjustment circuit 1 illustrated in FIG. 2(b) are the same as the waveforms, illustrated in FIG. 3(a), of the output signal of the comparator 12 of the pulse-width adjustment circuit 1 illustrated in FIG. 2(a) in all cases where the voltage of the feedback signal is the voltage A, the voltage B, and the voltage C. In other words, the basic operation of the pulse-width adjustment circuit 1 illustrated in FIG. 2(a) is the same as the pulse-width adjustment circuit 1 illustrated in FIG. 3(b).

Thus, the digital amplifiers 100 according to the first and second embodiments include neither a component that processes the inputted digital signal (such as a DSP (Digital Signal Processor) or FPGA (Field Programmable Gate Arrays)) nor a component for quantization and can amplify the inputted digital signal. In other words, each digital amplifier 100 enables a circuit structure to be simplified and enables costs to be decreased.

The digital amplifier 100 includes no component that processes the digital signal as above and consequently enables the inputted digital signal to be accurately amplified.

Since the digital amplifier 100 has the simplified circuit structure, the digital amplifier can make the best use of high-speed switching characteristics of a compound semiconductor power FET element that the switching circuit 2 includes.

The digital amplifier 100 refers the feedback signal that is generated based on the output signal of the switching circuit 2 to modulate the pulse width of the digital signal that is to be outputted. The digital amplifier 100 can thus provide feedback even when the input is the digital signal.

The digital amplifier 100 further includes the integrating element that convers the digital signal that is to be outputted into an analog signal to generate the feedback signal. The digital amplifier 100 adjusts the pulse width of the digital signal based on the signal level of the feedback signal that is generated as the analog signal by the integrating element. Accordingly, the digital amplifier 100 can provide appropriate feedback even when the input is the digital signal.

The digital amplifier 100 decreases the duty ratio of the output signal by feedback when the duty ratio of the output signal increases. Accordingly, the digital amplifier 100 can reduce a distortion factor and residual noise.

The digital amplifier 100 includes the low-pass filter circuit 5 at the rear stage of the switching circuit 2. Accordingly, the digital amplifier 100 can be used as an audio amplifier that causes a speaker to vibrate.

Third Embodiment

A third embodiment of the present invention will now be described with reference to FIG. 4 and FIG. 5. For convenience of description, members having the same functions as the members described according to the above embodiments are designated by like reference numbers, and a description thereof is omitted.
(Digital Amplifier 100a)

Figure 4:
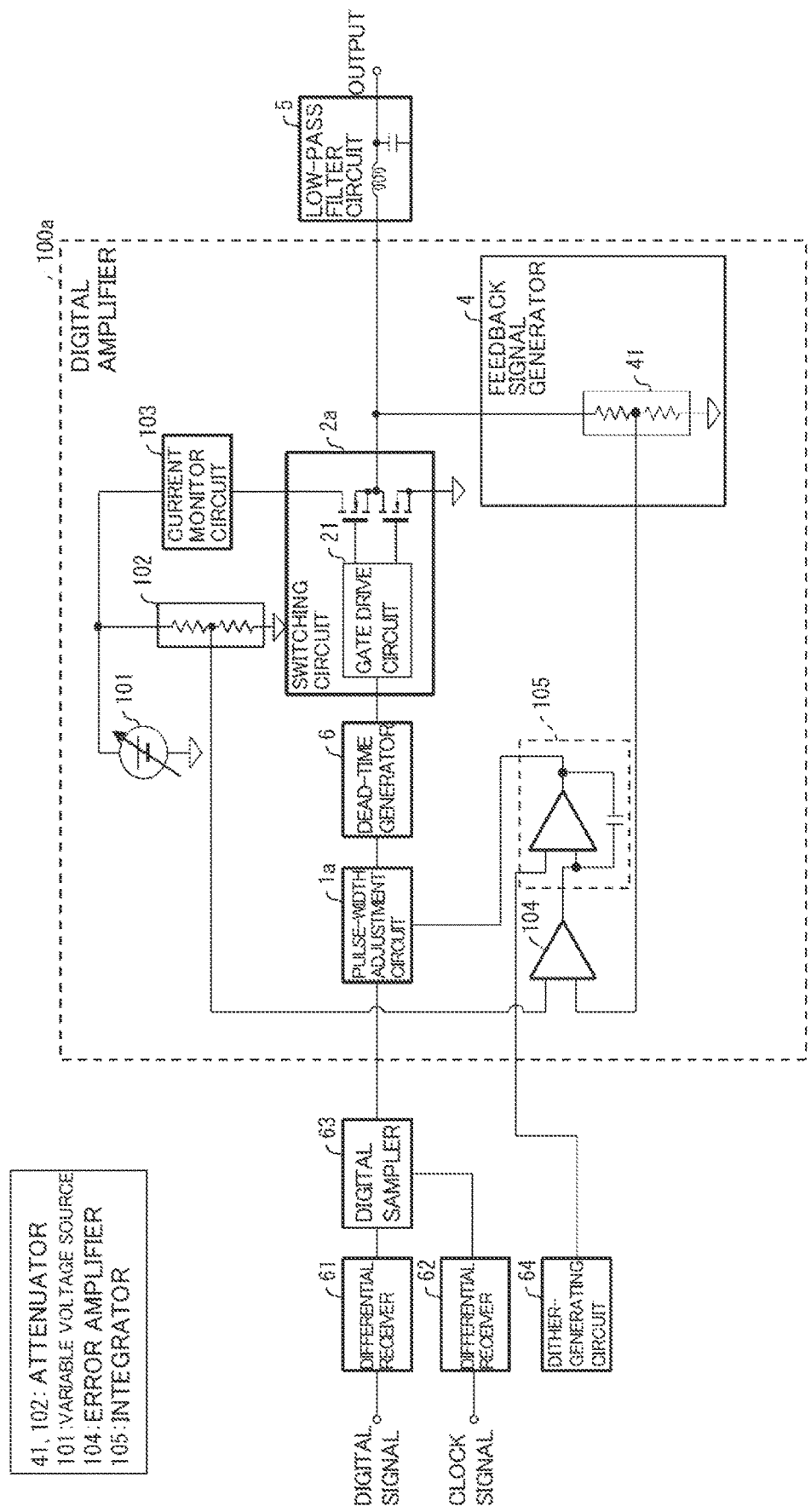
FIG. 4 illustrates a block diagram of the structure of a principal part of a digital amplifier according to a third embodiment of the present invention.

FIG. 4 illustrates a block diagram of the structure of a principal part of a digital amplifier 100a according to the third embodiment of the present invention. As illustrated in FIG. 4, the digital amplifier 100a includes a pulse-width adjustment circuit 1a, a switching circuit 2a, the feedback signal generator 4, a dead-time generator 6, a variable voltage source 101, an attenuator 102, a current monitor circuit 103, an error amplifier 104, and an integrator 105.

The pulse-width adjustment circuit 1a has the same structure as the above pulse-width adjustment circuit 1 except that the integrating element is not provided.

The switching circuit 2a includes a gate drive circuit 21 and drives two FETs to output a digital signal that is amplified.

The feedback signal generator 4 has the same structure as the feedback signal generator 4 according to the first embodiment described above, and a description thereof is omitted.

The dead-time generator 6 generates dead time for adjusting timing at which the two FETs of the switching circuit 2a are driven.

The variable voltage source 101 is a voltage source for providing a power supply voltage used when the switching circuit 2a amplifies the voltage and a reference voltage of the error amplifier 104 described later. The output voltage of the switching circuit 2a is adjusted by adjusting the variable voltage source 101.

The attenuator 102 adjusts the reference voltage of the error amplifier 104 described later.

The current monitor circuit 103 is a protection circuit for monitoring current that flows into the two FETs of the switching circuit 2a.

The error amplifier 104 compares the output signal of the switching circuit 2a with the reference voltage, outputs H when the output signal of the switching circuit 2a is more than the reference voltage, and outputs L when the output signal of the switching circuit 2a is less than the reference voltage.

The integrator 105 is an integrating element that integrates the output signal of the error amplifier 104. A dither signal that is outputted from a dither-generating circuit 64 described later is inputted into the integrator 105 to reduce noise of a signal that is to be outputted.

As illustrated in FIG. 4, the low-pass filter circuit 5 is connected to the digital amplifier 100a on the output side, and a differential receiver 61, a differential receiver 62, a digital sampler 63, and the dither-generating circuit 64 are connected to the digital amplifier 100a on the input side.

The low-pass filter circuit 5 includes an inductor and a capacitor and has the same function as the low-pass filter circuit 5 according to the first embodiment.

Digital signals of input signals are inputted into the differential receiver 61 from two signal lines. The differential receiver 61 outputs a digital signal based on a difference between the two signal lines.

Clock signals are inputted into the differential receiver 62 from two signal lines. The differential receiver 62 outputs a clock signal based on a difference between the two signal lines.

The digital signal that is outputted from the differential receiver 61 and the clock signal that is outputted from the differential receiver 62 are inputted into the digital sampler 63, which performs digital sampling based on the digital signal and the clock signal.

The dither-generating circuit 64 outputs the dither signal to reduce noise of the signal that is outputted from the digital amplifier 100a.

(BTL Connection)

An output device 120 that is obtained by BTL connection (Bridged Transformer less connection, or bridge connection) between two digital amplifiers 100a will be described with reference to FIG. 5. FIG. 5 illustrates a block diagram of the output device 120 in which the digital amplifiers 100a according to the third embodiment of the present invention are connected by BTL connection.

Figure 5:
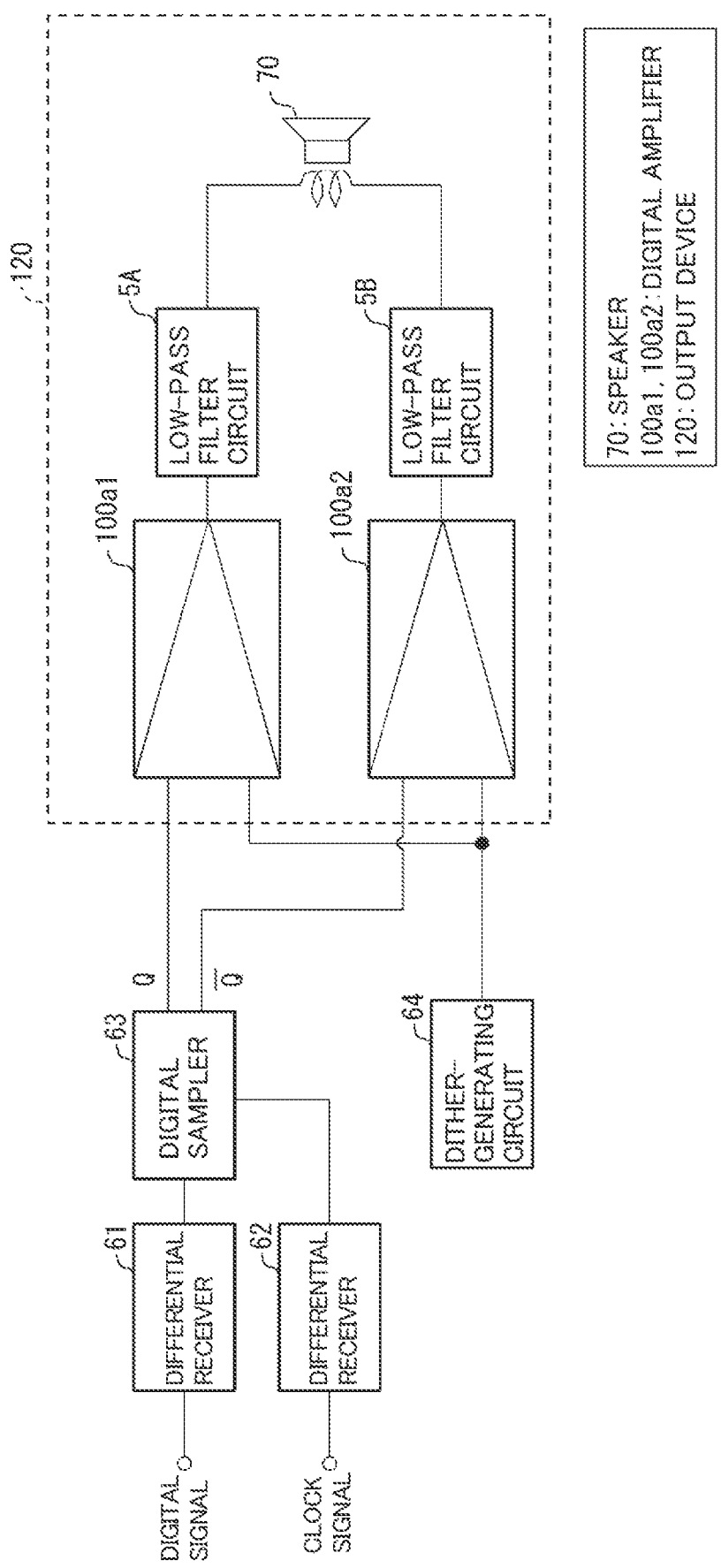
FIG. 5 illustrates a block diagram of an output device in which the digital amplifiers according to the third embodiment of the present invention are connected by BTL.

In the output device 120, as illustrated in FIG. 5, the output of the digital sampler 63 and the output of the dither-generating circuit 64 are inputted into a digital amplifier 100a1 (first amplifier) and a digital amplifier 100a2 (second amplifier). A low-pass filter circuit 5A and a low-pass filter circuit 5B are respectively connected to the digital amplifier 100a1 and the digital amplifier 100a2 on the output side. A speaker 70 (load) is connected to the low-pass filter circuit 5A and the low-pass filter circuit 5B on the output side. The output device 120 enables the speaker 70 to emit sound by amplifying audio signals that are digital signals that are inputted.

In the output device 120, the digital sampler 63 outputs a positive-phase signal to the digital amplifier 100a1 and outputs, to the digital amplifier 100a2, a signal that is in antiphase with the signal that is outputted to the digital amplifier 100a1. With this structure, DC components of the output signals of the digital amplifier 100a1 and the digital amplifier 100a2 can be canceled out.

The dither-generating circuit 64 outputs signals in phase to the digital amplifier 100a1 and the digital amplifier 100a2. With this structure, the dither signals of the digital amplifier 100a1 and the digital amplifier 100a2 can be canceled out by output.

In the output device 120 according to the present embodiment, the digital amplifier 100a1 and the digital amplifier 100a2 are thus connected by BTL connection. Accordingly, the output device 120 enables a digital amplifier having an output voltage that is doubled to be achieved.

Each digital amplifier 100a further includes the error amplifier 104 that compares the output voltage of the switching circuit 2a with the reference voltage. The integrator 105 generates the feedback signal by integrating the output signal of the error amplifier 104. Accordingly, each digital amplifier 100a can appropriately remove noise of the output signal of the switching circuit 2.

[Summary]

A digital amplifier (100, 100a) according to a first aspect of the present invention includes a pulse-width adjustment circuit (1, 1a) that adjusts the pulse width of a digital signal, a switching circuit (2, 2a) that amplifies the output signal of the pulse-width adjustment circuit, and a feedback signal generator (4) that generates a feedback signal based on the output signal of the switching circuit. The pulse-width adjustment circuit adjusts the pulse width of the digital signal with reference to the feedback signal.

With the above structure, the digital amplifier enables a circuit structure to be simplified and enables costs to be decreased. The digital amplifier enables an inputted digital signal to be accurately amplified. The digital amplifier can make the best use of high-speed switching characteristics of a compound semiconductor power FET element that the switching circuit 2 includes. The digital amplifier can provide feedback even when the input is the digital signal.

In a digital amplifier according to a second aspect of the present invention, the feedback signal generator according to the above first aspect may include an integrator (105) that generates the feedback signal by converting the output signal of the switching circuit into an analog signal. The pulse-width adjustment circuit may adjust the pulse width of the digital signal based on the signal level of the feedback signal.

With the above structure, the digital amplifier can provide appropriate feedback even when the input is the digital signal.

In a digital amplifier according to a third aspect of the present invention, the feedback signal generator according to the above second aspect may further include a comparator (error amplifier 104) that compares the output signal of the switching circuit with a reference voltage. The integrator may generate the feedback signal by integrating the output signal of the comparator.

With the above structure, noise of the output signal of the switching circuit can be appropriately removed.

In a digital amplifier according to a fourth aspect of the present invention, the pulse-width adjustment circuit according to any one of the above first to third aspects may decrease the duty ratio of the output signal of the pulse-width adjustment circuit when the duty ratio of the output signal of the switching circuit increases.

With the above structure, the digital amplifier can reduce a distortion factor and residual noise.

A digital amplifier according to a fifth aspect of the present invention may further include a low-pass filter (low-pass filter circuit 5) at a rear stage of the switching circuit in any one of the above first to fourth aspects.

With the above structure, the digital amplifier can be used as an audio amplifier that causes a speaker to vibrate.

An output device (120) according to a sixth aspect of the present invention includes a first amplifier (digital amplifier 100a1) that amplifies a first digital signal, a second amplifier (digital amplifier 100a2) that amplifies a second digital signal that is in antiphase with the first digital signal, and a load (speaker 70) that is connected to the first amplifier and the second amplifier. The first amplifier includes a first pulse-width adjustment circuit that adjusts the pulse width of the first digital signal, a first switching circuit that amplifies the output signal of the first pulse-width adjustment circuit, and a first feedback signal generator that generates a feedback signal based on the output signal of the first switching circuit. The first pulse-width adjustment circuit adjusts the pulse width of the digital signal with reference to the feedback signal. The second amplifier includes a second pulse-width adjustment circuit that adjusts the pulse width of the second digital signal, a second switching circuit that amplifies the output signal of the second pulse-width adjustment circuit, and a first feedback signal generator that generates a feedback signal based on the output signal of the second switching circuit. The second pulse-width adjustment circuit adjusts the pulse width of the digital signal with reference to the feedback signal.

With the above structure, the output device enables a digital amplifier having an output voltage that is doubled to be achieved.

An embodiment of the present invention is not limited to the above embodiments, and various modifications can be made within the scope of claims. The technical scope of an embodiment of the present invention includes an embodiment that is obtained by a proper combination of technical features disclosed in the different embodiments. The combination of the technical features disclosed in the embodiments enables the formation of a new technical feature.

REFERENCE SIGNS LIST 1, 1a pulse-width adjustment circuit
2, 2a switching circuit
3 power supply circuit
4 feedback signal generator
5, 5A, 5B low-pass filter circuit (low-pass filter)
12 comparator
13 constant-current driver circuit
41 attenuator
70 speaker (load)
104 error amplifier (comparator)
105 integrator
100, 100a digital amplifier
100a1 digital amplifier (first amplifier)
100a2 digital amplifier (second amplifier)
120 output device

The invention claimed is:
1. A digital amplifier comprising:
a pulse-width adjustment circuit that adjusts a pulse width of a digital signal;
a switching circuit that amplifies an output signal of the pulse-width adjustment circuit; and
a feedback signal generator that generates a feedback signal based on an output signal of the switching circuit,
wherein the pulse-width adjustment circuit adjusts the pulse width of the digital signal with reference to the feedback signal and based on a signal level of the feedback signal,
wherein the feedback signal generator includes an integrator that generates the feedback signal by converting the output signal of the switching circuit into an analog signal and a comparator that compares the output signal of the switching circuit with a reference voltage, and
wherein the integrator generates the feedback signal by integrating an output signal of the comparator.

2. The digital amplifier according to claim 1,
wherein the pulse-width adjustment circuit decreases a duty ratio of the output signal of the pulse-width adjustment circuit when a duty ratio of the output signal of the switching circuit increases.

3. The digital amplifier according to claim 1, further comprising: a low-pass filter at a rear stage of the switching circuit.

4. An output device comprising:
a first amplifier that amplifies a first digital signal;
a second amplifier that amplifies a second digital signal that is in anaphase with the first digital signal; and
a load that is connected to the first amplifier and the second amplifier,
wherein the first amplifier includes
a first pulse-width adjustment circuit that adjusts a pulse width of the first digital signal,
a first switching circuit that amplifies an output signal of the first pulse-width adjustment circuit; and
a first feedback signal generator that generates a first feedback signal based on an output signal of the first switching circuit,
wherein the first pulse-width adjustment circuit adjusts the pulse width of the first digital signal with reference to the first feedback signal and based on a signal level of the first feedback signal,
wherein the first feedback signal generator includes a first integrator that generates the first feedback signal by converting the output signal of the first switching circuit into an analog signal and a first comparator that compares the output signal of the first switching circuit with a first reference voltage,
wherein the first integrator generates the first feedback signal by integrating an output signal of the first comparator,
wherein the second amplifier includes
a second pulse-width adjustment circuit that adjusts a pulse width of the second digital signal,
a second switching circuit that amplifies an output signal of the second pulse-width adjustment circuit, and
a second feedback signal generator that generates a second feedback signal based on an output signal of the second switching circuit, and
wherein the second pulse-width adjustment circuit adjusts the pulse width of the second digital signal with reference to the second feedback signal and based on a signal level of the second feedback signal,
wherein the second feedback signal generator includes a second integrator that generates the second feedback signal by converting the output signal of the second switching circuit into an analog signal and a second comparator that compares the output signal of the second switching circuit with a second reference voltage, and wherein the second integrator generates the second feedback signal by integrating an output signal of the second comparator.

\* \* \* \* \*